United States Patent [19]
Bamji et al.

[11] Patent Number: 5,581,474
[45] Date of Patent: Dec. 3, 1996

[54] IDENTIFYING OVERCONSTRAINTS USING PORT ABSTRACTION GRAPHS

[75] Inventors: Cyrus Bamji; Ravi Varadarajan, both of Fremont, Calif.

[73] Assignee: Cadence Design Systems, Inc., San Jose, Calif.

[21] Appl. No.: 609,600

[22] Filed: Mar. 5, 1996

Related U.S. Application Data

[62] Division of Ser. No. 184,868, Jan. 21, 1994.

[51] Int. Cl.[6] .................................................. G06F 17/50
[52] U.S. Cl. ........................ 364/490; 364/488; 364/489; 364/491
[58] Field of Search .................................... 364/488, 489, 364/490, 491

[56] References Cited

U.S. PATENT DOCUMENTS

| | | | |
|---|---|---|---|
| 5,079,717 | 1/1992 | Miwa | 364/490 |
| 5,097,422 | 3/1992 | Corbin, II et al. | 364/491 |
| 5,381,343 | 1/1995 | Bamji et al. | 364/488 |

OTHER PUBLICATIONS

Bushnell et al., "Automated Design Tool Execution in the Ulysses Design Environment," IEEE Trans. on CAD, vol. 8, No. 3, Mar. 1989, pp. 279–287.

Ishima et al., "An Algorithm to Detect Positive Cycles in a Constraint Graph for Layout Compaction," 1990 IEEE Int'l Symp. on Ckts & Sys., pp. 2853–2856.

Lo et al., "An $O(n^{1.5} \log n)$ 1-d Compaction Algorithm," 1990 27th ACM/IEEE Design Automation Conference, Paper 22.3, pp. 382–387.

Martineau et al., "Automatic Jog Insertion for 2D Mask Compaction,: A Global Optimization Perspective," 1992 European Design Automation Conference, pp. 508–512.

Marple, "A Hierarchy Preserving Hierarchical Compactor," 1990 27th ACM/IEEE Design Automation Conference, pp. 375–381.

Schiele, "Compaction w/incremental Over–Constraint Resolution," 1988 ACM/IEEE Design Automation Conference, pp. 390–395.

De Lange et al., "A Hierarchical Constraint Graph Generation and Compaction System for Symbolic Layout," ICCD '89, pp. 532–535.

Ahmad, "Simple Enumeration of Minimal Cutsets of Acyclic Directed Graphs," IEEE Trans. on Reliability, vol. 37, No. 5, Dec. 1988, pp. 484–487.

Chen et al., "VLSI Layout Compaction W/Conditional Constraints," 1991 IEEE Int'l Symposium on Circuits and Systems, pp. 2132–2135.

Kim et al., "A New Hierarchical Layout Compactor Using Simplified Graph Models", 1992 29th ACM/IEEE Design Automation Conference, pp. 323–326.

Boyer, "Symbolic Layout Compaction Review," 1988 25th ACM/IEEE Design Automation Conference, pp. 383–389.

Perez–Segovia et al., "Cactus: A Symbolic CMOS Two–Dimensional Compactor," 1990 European Design Automation Conference, pp. 201–205.

(List continued on next page.)

*Primary Examiner*—Kevin J. Teska
*Assistant Examiner*—Leigh Marie Garbowski
*Attorney, Agent, or Firm*—Fenwick & West LLP

[57] ABSTRACT

Overconstraints in a system, such as an electrical circuit layout, are identified using port abstraction graphs. Intercell pitchmatching constraints are represented by meta-edges between cells. Classes of edges which can be represented by a support edge are created, and the value of the class edges are increased to the value of the support edge. The edge values are updated in the graphs, and the redundant edges eliminated. Overconstraints are identified as positive cycles in the graphs, and a database of the layout is annotated and graphically displayed. The graphical display responds to user inputs to manipulate the display of the relations between constraints. The use of the port abstraction graphs also reduces the number of equations that need to be solved to compact the layout.

3 Claims, 9 Drawing Sheets

OTHER PUBLICATIONS

Bamji et al., "Hierarchical Pitchmatching Compaction Using Minimum Design," 1992 ACM/IEEE Design Automation Conference, pp. 311–317.

Dutt et al., "On Minimal Closure Constraint Generation for Symbolic Cell Assembly," 28th ACM/IEEE Design Automation Conference 1991, pp. 736–739.

Lee et al., "Himalayas: A Hierarchical Compaction System w/a Minimized Constraint Set," IEEE, Aug. 1992, pp. 150–157.

IDENTIFYING OVERCONSTRAINTS USING PORT ABSTRACTION GRAPHS

RELATED APPLICATION

This is a divisional application of U.S. patent application Ser. No. 08/184,868 filed Jan. 21, 1994.

This application is related to the application Ser. No. 07/889,831, filed on May 26, 1992 by Cyrus Bamji and Ravi Varadarajan, entitled *Hierarchical Pitchmatching Compaction Method and System for Integrated Circuit Design*, which is incorporated by reference herein.

BACKGROUND

1. Field of the Invention

The present invention relates generally to the field of automated design techniques, and more particularly to methods and systems for identifying overconstraints during hierarchical compaction of integrated circuits.

2. Description of the Background Art

Many structures and systems are comprised of components whose interrelations are defined by a design rules. Such structures are often designed using automated design techniques employing symbolic representations of the structure and its elements. An example of such a structure is an integrated circuit.

The physical design of an integrated circuit is generally carried out in terms of the symbolic layout of the circuit, rather than the actual geometry of the masks and layers that comprise the chip. When creating mask works for integrated circuits, designers typically begin with a circuit schematic consisting of an interconnected network of logic or circuit elements. The designer generally has available a library of mask work patterns or "cells" which corresponds to the various circuit element used in the design. Creating a mask work then consists of transforming the circuit schematic by substituting various cells for the schematic circuit elements in such a way as to efficiently use the available mask area. The designer can thus work with transistors, wires, and other primitive components, and groups of these components using symbolic representations of these circuit elements. The symbolic layout provides a higher level of abstraction than the mask layout, and is therefore easier for the designer to manipulate. The use of a symbolic representation allows the designer to simulate and verify the logical operation of the circuit before actual fabrication.

A symbolic layout that contains only primitive symbols, i.e. transistors, wires, capacitors and other physical components, is termed a "leaf cell." The connections between cells are called "ports." Many layouts contain a large number of groups of components that are substantially identical. Such a group may be used to define a cell, and the description of the layout may then be simplified by treating each such group as an instance of this cell. The cell has its own symbol; for example it may be represented as a rectangle with various ports for connecting wires or for abutment with ports of adjacent cells that are represented similarly. The components of the overall layout then may consist of many cells, and the layout represents their relative placement and interconnection. Describing the layout in terms of cells rather than primitive symbols, further simplifies the designer's task.

Obviously this process of grouping elements and cells may be repeated, so that a symbolic layout can be treated as a hierarchical structure with multiple levels. Each level is a symbolic layout of various cells and primitive components. Each such cell is in turn a symbolic layout of subcells and primitive components, and this layout defines the next lower level of the hierarchy. Since there may be more than one type of cell at any given level, the next lower level may contain several different branches. The cells at the lowest level are leaf cells since they contain no subcells, but only primitive components. Cells at any other level are "hierarchy cells." The hierarchy can be visualized as an inverted "tree" with branches extending downward, and the lowest level depends on the branch in which it is located. In short, the leaf cells are at the ends of the branches, and the trunk of the tree represents the symbolic layout of the whole chip, which is often termed the "root cell." This hierarchical description is a natural and concise representation for large designs.

Once the symbolic layout is designed it is tested to verify its logical functioning. Any defective operation is remediated by design changes and re-verified. Once the design verification is completed, the layout is translated into a mask layout suitable for the actual fabrication of the chip. The translation maps the symbolic representation of the layout into a physical structure that implements the function of the layout. This translation requires additional technical information regarding the fabrication technology, which is stored in a "technology database" and used when the translation is carried out. For example, with semiconductor chips, the translation specifies the configuration of the physical structure of the circuit, identifying the precise placement and relationship of the various layers of semiconductors, insulators, substrates and the like. Using the translated layout, the masks for the circuit are prepared and the circuit is fabricated. The fabricated circuit is tested to verify its functional operation. Changes are made to the symbolic layout to remediate discrepancies between the intended and actual operation of the circuit, and a new mask work and chip is fabricated. This design and verify process is repeated until the chip operates as intended.

The task of integrated circuit design generally includes minimizing the geometrical size of the total structure. Minimization of size increases circuit performance by decreasing signal transmission distances. Minimization directly seeks to reduce the space between the physical elements comprising the circuit, such as traces, contacts between layers, and the like. The minimization process is subject to separation constraints that ensure that the technical design rules are followed and the integrity of the circuit is maintained.

Separation constraints generally describe the placement of circuit elements with respect to other circuit elements. There are three basic types of separation constraints:

1. Lower bound constraints: These are constraints that require, for two circuit elements A and B, that B is at least X units greater than A. Formally: $A+X \leq B$.

2. Upper bound constraints: These are constraints that require, for two circuit elements A and B, that B is no more than X units greater than A. Formally: $A+X \geq B$.

3. Equality constraints: These are constraints that require, for two circuit elements A and B, that A is X units from B. Formally: $A+X=B$.

The constraints that must be adhered to in minimizing a layout are of two types:

1. Constraints inherently present in the layout. These are constraints that enforce design rule correctness and preserve the underlying circuit integrity.

2. Additional constraints required by the user, called user defined constraints.

Inherent constraints, for example, require certain components of the circuit to be separated by a minimum distance, and the connections between different components must be maintained. User defined constraints may include requiring a cell to be of a minimum size to properly interface with other components.

The automated process of size minimization is known as compaction. A compactor is a computer program that operates on the input data of a symbolic layout, and produces a new symbolic layout. This new layout corresponds to a design of the minimum size circuit that preserves the integrity of the original circuit and complies with the design rule requirements. Compaction minimizes an objective function (generally representing the size of the layout in one dimension), while satisfying all constraints in the layout.

In some layouts, the defined constraints cannot all be satisfied simultaneously and there is no legal solution to the compaction problem. Such a system is said to be "overconstrained." For example, assume a circuit with elements A, B, and C, and the following constraints:

B is at least 5 units greater than A ($A+5 \leq B$);

C is at least 10 units greater than B ($B+10 \leq C$);

C is no more than 11 units greater than A ($A+11 \geq C$).

This system of separation constraints cannot be satisfied because the first two require that A is at least 15 units from C, but the last requires that A is no more than 11 units from C. Thus this system is overconstrained.

Current methods for identifying overconstraints are limited to leaf cells, and cannot identify overconstraints in hierarchical layouts. However, overconstraints are likely to be present in many large hierarchical layouts. It would be useful to have a compactor having an efficient method to identify and explain the overconstraints in hierarchical layouts and provide meaningful feedback to the user to eliminate them.

Because circuits can contain a complex hierarchy of cells, compaction of the physical structure of the circuit must maintain the logical and physical relationships between circuit elements in different levels of the hierarchy. It is necessary to both compact the organization of elements within a leaf cell and to maintain the port connectivity between abutting cells, termed "pitchmatching," while preserving the hierarchical structure. Given these requirements, the global compaction problem is formulated as a linear programming problem, which is solved by the "Revised Simplex Method."

Because the constraint system for hierarchical pitchmatching compaction is solved by linear programming, it is much more difficult to detect the source of the overconstraints. In contrast to leaf cell compaction, where the overconstraints are localized within a cell, in hierarchical compaction overconstraints usually occur due to the complex interaction of cells between and across the levels of hierarchy. Thus it is desirable to provide a method of displaying to the designer the relations between cells that lead to the overconstraint.

Further, as the number of variables and constraints that must be handled grows with the size of the hierarchy, the computation time increases rapidly with the hierarchy size. Hence, the complexity of the method is significant and the size of the layout that can be dealt with is limited. It is desirable then to provide a method that reduces the number of variables and constraints that must be solved to compact the layout, effectively increasing the size of layouts and complexity that can be efficiently designed.

In the discussion that follows the overconstraint system and method will be directed to the reduction of geometrical areas of an integrated circuit layout. It should be noted, however, that this method and system find useful application in the compaction of circuit board layouts as well.

SUMMARY

The invention provides a method and a system for identifying and graphically displaying overconstraints in a layout. A non-heuristic graph-based method processes a system of equations before they are solved by linear programming to compact the layout. The system of equations that describe the hierarchical compaction problem and that need to be solved by linear programming can be factored into three classes of constraints:

1. Intracell constraints that arise from constraints between shapes and devices within each of the leaf cells.

2. Intercell constraints that arise from electrical and geometrical interactions between the leaf cells.

3. Loop constraints that capture the geometric pattern of instances of cells in the layout.

The invention converts the intracell and intercell constraints of instances of each leaf cell into graphical representation called "port abstraction graphs." The port abstraction graphs have vertices for representing the ports, or connections, between cells, and edges for representing the separation constraints imposed on the ports by its internal construction. A meta-edge between the vertices of the port abstraction graphs represents the logical relationship between connected ports in different cells or within a cell. The invention identifies and classifies the edges of the port abstraction graphs and processes their values until individual edges, representing the most significant constraints between cells, are identified. Redundant edges are eliminated, reducing the number of variables and constraints to process during compaction. As the edges have signed values representing the separation constraints, positive and negative cycles are formed along connected edges in the port abstraction graphs. Overconstraints are manifest as positive cycles in the port abstraction graphs, and are annotated in a database. The edges contributing to the overconstraints are displayed, along with the required spacing constraints between them, letting the designer quickly locate the source of the overconstraints. A designer can thus graphically examine the annotated database to pinpoint the cause and location(s) involved in the overconstraint. Identifying overconstraints in the leaf cells implicitly identifies overconstraints in hierarchical cells.

DESCRIPTION OF THE PREFERRED EMBODIMENT

Figure 1:
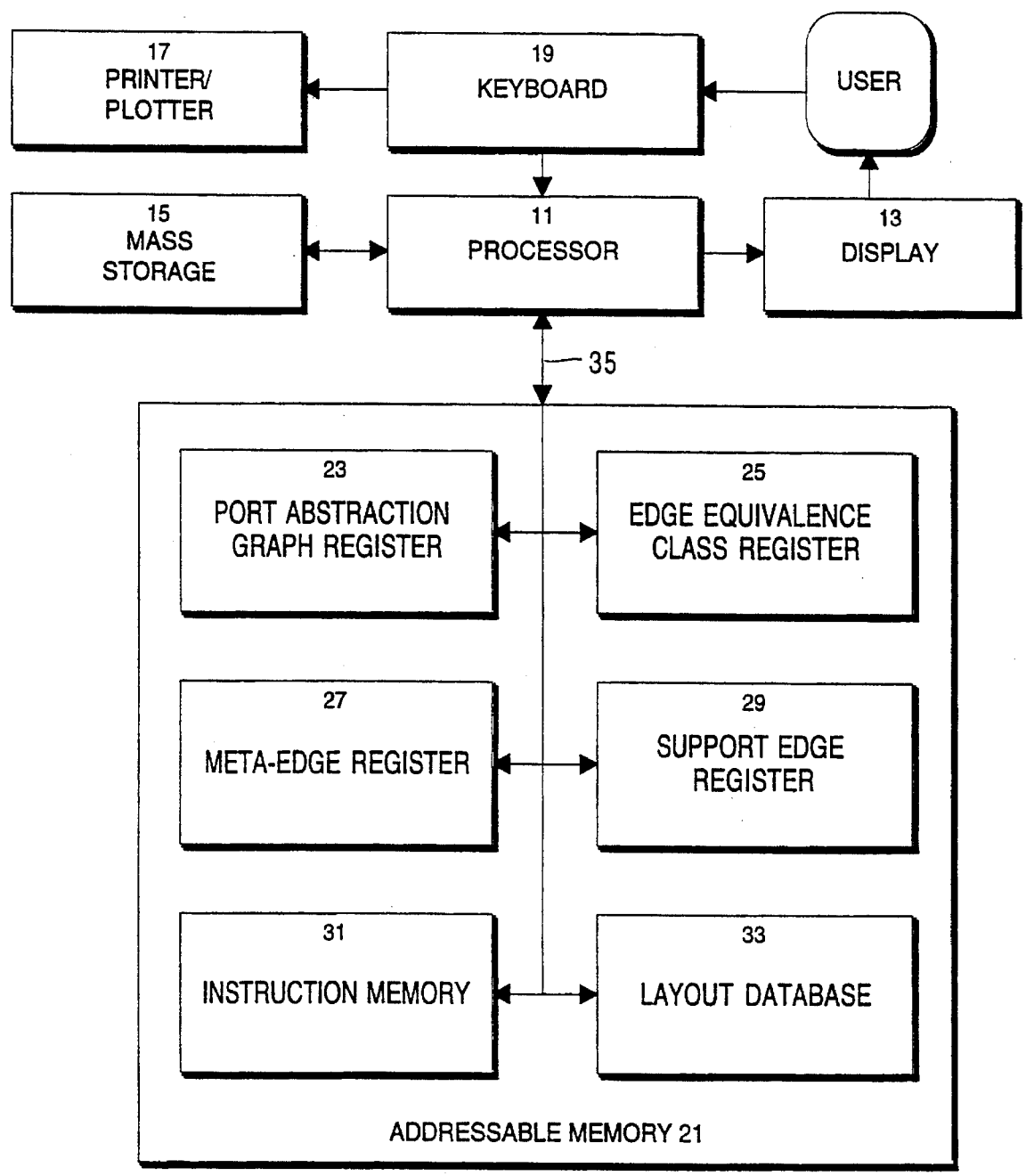
FIG. 1 is a block diagram of a system for identifying and displaying overconstraints in a layout.

Referring now to FIG. 1, there is shown a pictorial illustration of a system for identifying and displaying overconstraints in the layout of an electrical circuit. The preferred embodiment is implemented on a general purpose computer such as a Sun Microsystems, Inc. workstation. Utilizing dedicated software, the general purpose computer specifically configures memory and system peripherals for executing steps of the method of the present invention.

Overconstraint system 100 comprises processor 11, display 13, mass storage 15, printer 17, keyboard 19, and addressable memory 21. Processor 11 executes method steps stored in, and retrieves and stores information to, addressable memory 21. Keyboard 19 and display 13 provide a user interface to processor 11. Printer 17 generates a permanent record of the overconstrained circuit component.

Processor 11 is connected to various memories and storage devices in addressable memory 21 through data bus 35. Connected to data bus 35 are port abstraction graph register 23, edge equivalence class register 25, meta-edge register 27, support edge register 29, and layout database 33. Each of these registers is accessed by processor 11 to obtain and store information according to method steps stored in instruction memory 31.

Figure 2A:
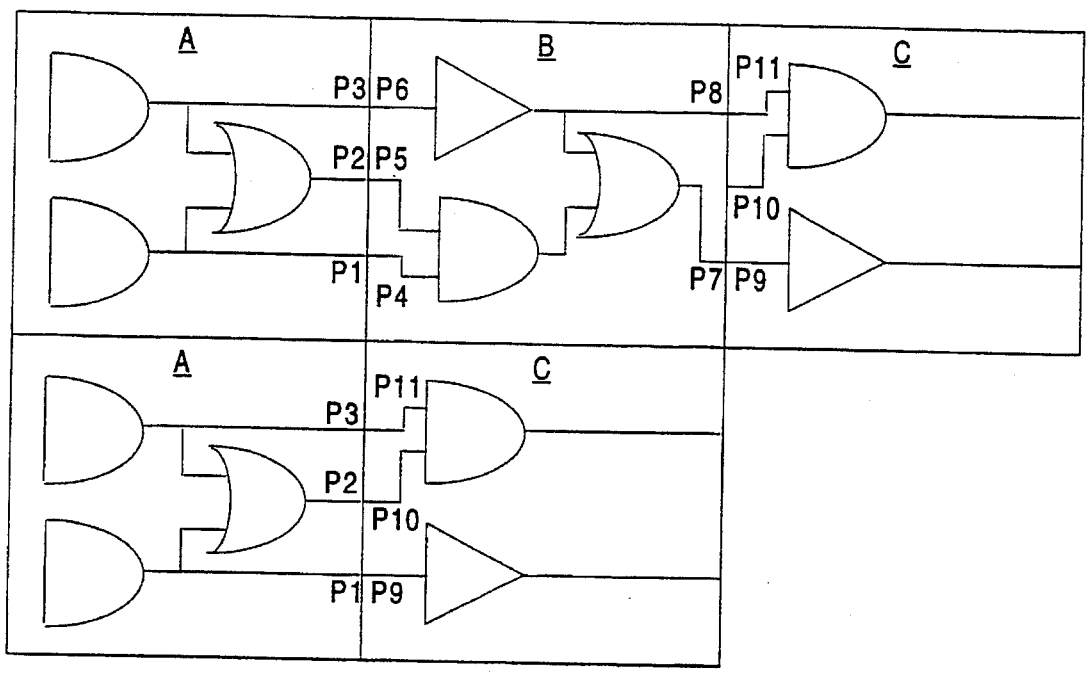
FIG. 2A is a pictorial illustration of a layout schematic containing cells.

Layout database 33 contains a coordinate description of a circuit layout having a plurality of cells, each cell containing either other cells or circuit elements. Each circuit element in each cell is identified along with its coordinates. Ports, which are the connections between cells are also identified for each cell. FIG. 2A shows an abstracted schematic of a layout of circuit elements, showing cells A, B, and C containing various AND, NOR gates, and inverters with ports P1–P11 coupling abutting cells. Layout database 33 would contain a description of each cell sufficient to describe the internal circuit elements, including their ports and positions. Display 13 provides a graphical display of the circuit elements stored in layout database 33 following the identification of overconstraints by the method of the preferred embodiment.

Figure 2B:
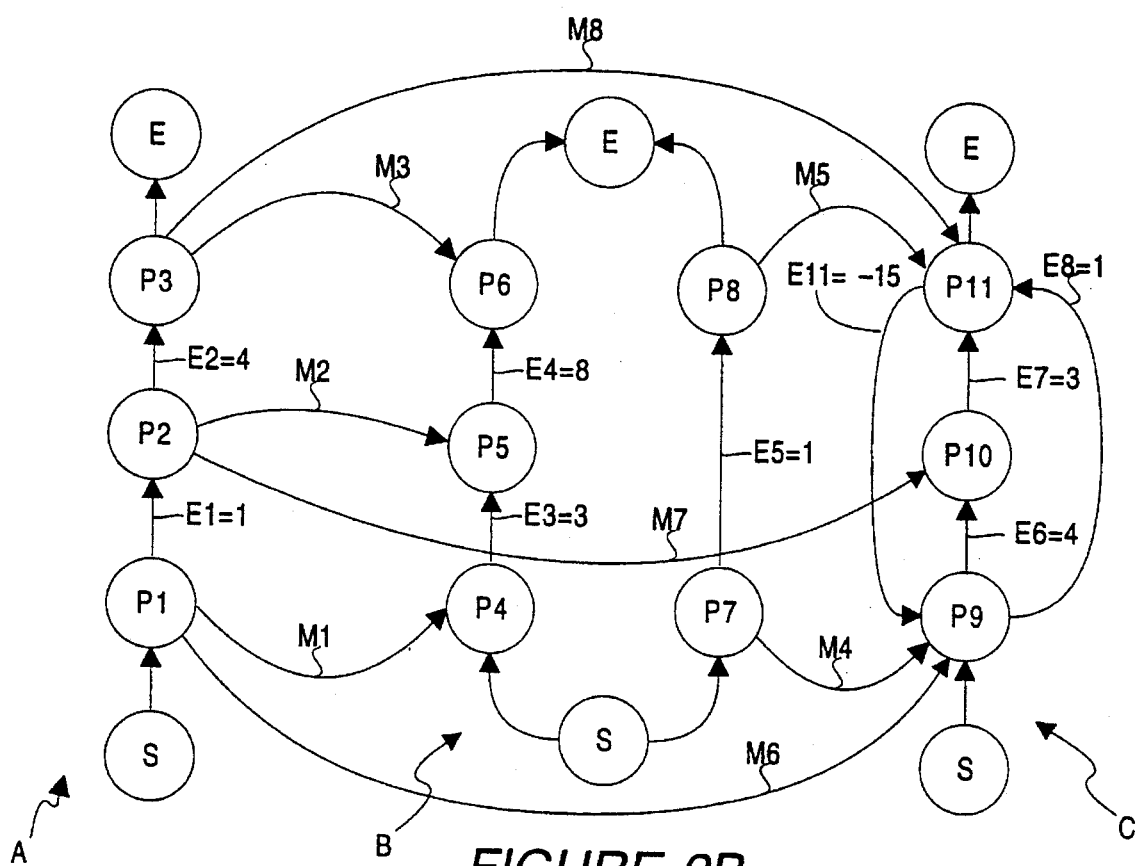
FIG. 2B is a pictorial illustration of three port abstraction graphs linked by meta-edges.

Processor 11 accesses the information stored in layout database 33 to create port abstraction graphs of each unique leaf cell in the layout, which are then stored in port abstraction graph register 23. FIG. 2B shows the port abstraction graphs of cells A, B, and C of FIG. 2A. In each port abstraction graph a source vertex S is created and edges between the source vertex S and other vertices are created such that all vertices are reachable along a path from the source vertex S. A sink vertex E is also created and edges are added to the sink vertex E such that the sink vertex E is reachable from any vertex. The connections between cells A, B, and C are made through ports. In the port abstraction graph for a cell the ports of the cells are represented by vertices. These are shown in FIG. 2B as ports P1, P2, and P3 for cell A, ports P4, P5, and P6 for cell B, and ports P9, P10 and P11 for cell C.

The separation constraints between the ports of a cell become edges in a port abstraction graph. FIG. 2B shows the separation constraints from the cells of FIG. 2A as edges E1–E11. These edges have values that are the spacing requirements induced on the ports by the circuit elements of the cell and the circuit designer. Each edge E1–E11 has a direction, as represented by the arrow, running from a source port to a sink port. Positive values are minimum separation requirements, and negative values are maximum separation requirements, from the source port to the sink port. Thus in FIG. 2B, in the port abstraction graph of cell A, ports P1 and P2 are separated by edge E1 having a value of (10), running from port P1 to port P2. This means that port P2 (the sink port) must be separated by at least 10 units from port P1 (the source port). Similarly, in cell C, ports P9 and P11 are separated by edge E11 with a value of (−15); thus port P9 can be no more than 15 units from port P11. The edge values are the intracell constraints, as described above, and are determined by performing a transitive closure analysis on a leaf cell constraint graph, as described in the related application, and in C. Bamji and R. Varadarajan, *Hierarchical Pitchmatching Compaction Using Minimum Design*, ACM IEEE 29th Design Automation Conference, 1992. The method of the preferred embodiment uses the direction and value of edges E1–E11 to identify overconstraints in cells A, B, and C.

Processor 11 accesses layout database 33 to identify and store meta-edges of the port abstraction graphs in meta-edge register 27. Meta-edges M represent pitchmatching constraints between cells sharing a given interface I. FIG. 2A shows cells A and B sharing interface I(AB). Each interface I gives rise to a set of intercell constraints that capture the connection requirements for that interface. Each intercell constraint is represented by a meta-edge M between the corresponding ports of the respective port abstraction graphs of the cells sharing the interface.

FIG. 2B shows meta-edges M1 through M8 between the port abstraction graphs of cells A, B, and C. Specifically, cells A and B share interface I(AB) (FIG. 2A), and have meta-edges M1, M2, and M3 along that interface between the pairs of corresponding ports (P1, P4), (P2, P5) and (P3, P6), respectively. Similarly, between cells B and C meta-edges M4 and M5 couple pairs of ports (P7, P9) and (P8, P11) respectively, across interface I(BC) (FIG. 2A). As FIG. 2A shows, cell A is also coupled to cell C along interface I(AC). Thus the port abstraction graphs of these cells show meta-edges M6, M7 and M8 between pairs of ports (P1, P9) (P2, P10) and (P3, P11), respectively.

The direction of each meta-edge M is the same as the direction of the interface between its origin cell and each meta-edge M is labeled in the port abstraction register 23 with the interface I that generates that connection. If an interface I is defined from a cell to itself (for example if cell A were coupled to another cell A), the source and sink ports of the meta-edge M are in the same port abstraction graph (e.g. there would be a meta-edge M looping from port P1 to port P2). Once all the meta-edges M have been identified, they are stored in meta-edge register 27, with indicia of their source and sink ports, and interfaces I.

Processor 11 accesses port abstraction graph register 23 and the meta-edge register 27 to obtain data to identify and store sets of separation constraints in edge equivalence class register 25. An edge equivalence class contains edges E of port abstraction graphs which share ports P bound by a pair of meta-edges M along a common interface I. Generally, any two edges E of the port abstraction graphs, whose source and sink ports P are connected together by meta-edges M(A) and M(B) of the same interface I are said to be in the same edge equivalence class.

Formally, Edges Ei and Ej in port abstraction graphs are in the same edge equivalence class, if and only if:

1. The source port of Ei, is connected to the source port of Ej by a meta-edge M(source(i,j)):

2. The sink port of Ei is connected to the sink port of Ej by a meta-edge M(sink(i,j)); and 3. M(sink(i,j)) and M(source(i,j)) have the same interface I.

The edge equivalence classes are computed by the union find method of R.E. Tarjan, described in Data Structures and Network Algorithms, SIAM, Philadelphia, Pa., 1986. For every pair of edges E in the port abstraction graphs that meet the criteria of edge equivalence, their equivalence classes are merged.

Figure 3:
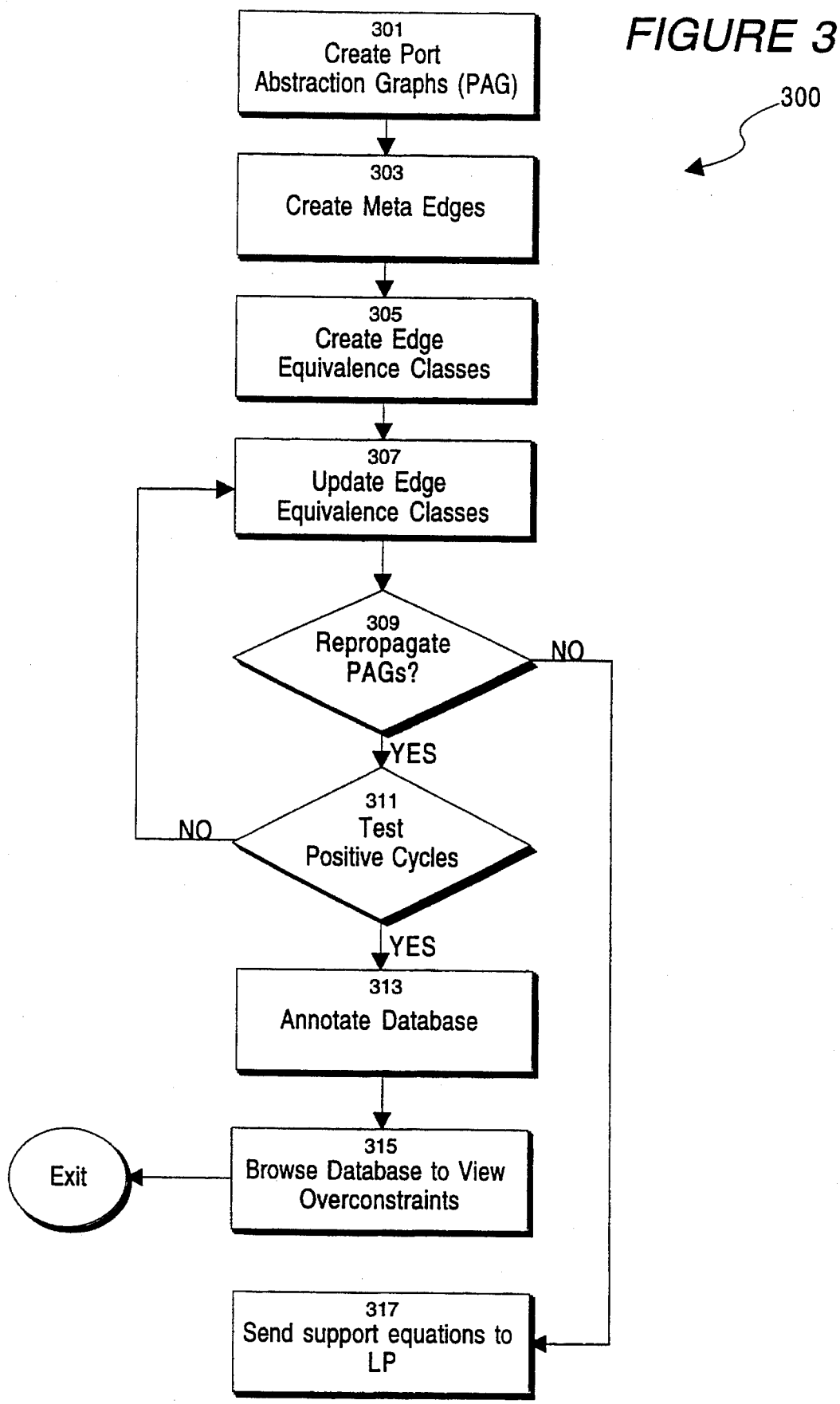
FIG. 3 is a flow chart of a method for identifying overconstraints.

Referring now to FIG. 3, there is shown a flow chart of the process 300 for identifying overconstraints. As stated above, a layout is comprised of either leaf cells or hierarchy cells, the former containing primitive elements, and the latter containing other cells, including leaf cells. Since most circuits are made of repeating cell structures, there are relatively few unique leaf cells within a layout. Thus instead of reviewing every cell instance in the layout, it is sufficient to analyze each unique leaf cell. For each unique leaf cell then, a port abstraction graph is created 301, and stored in the port abstraction graph register 23.

Next, the overconstraint process creates 303 meta-edges M from the port abstraction graphs. As there are a relatively small number of unique leaf cells, so too are there relatively few unique interfaces I between cells. Since meta-edges M are bound to the interfaces, each unique interface I is identified in layout database 33. For each unique interface, the ports P coupled to the interface are examined, and meta-edges M between those ports P are created 303, and stored in meta-edge register 27.

Figure 4:
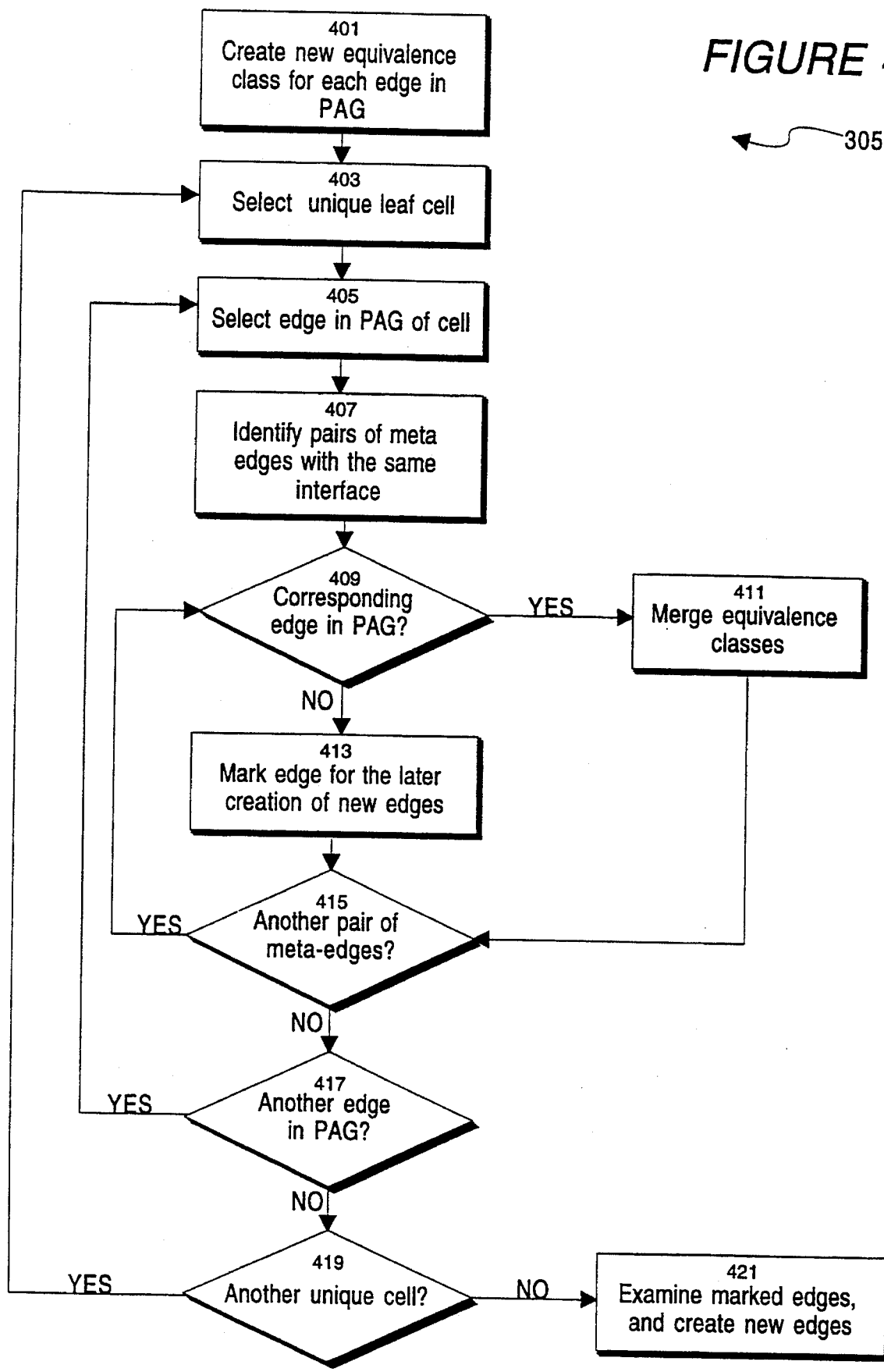
FIG. 4 is a flow chart of the process of creating edge equivalence classes.

Once meta-edges M are created for each interface, the edge equivalence class are created 305, according to a process shown in FIG. 4. The edges comprising each equivalence class, as defined above, are stored in edge equivalence register 25. For the purposes of the discussion of the process 300, with respect to FIG. 2C, it suffices to state that the edge equivalence classes are {E1, E3, E6}, {E2, E4, E7}, {E5, E8, E9, E10}, and {E11, E12, E13 }. Edges E9 and E10 are new edges created during the creation 305 of the edge equivalence class to provide corresponding edges to edge E8. Likewise, edges E12, and E13 were new edges created 305 to provide corresponding edges to edge E11. The values of E9, E10, E12, and E13 are set to negative infinity. The process of creating 305 the edge equivalence classes will be further described below with respect to FIG. 4.

Following the creation 305 of the edge equivalence classes, process 300 then updates 307 each class. Updating 307 replaces the constraint values of all the edges E in an equivalence class with the value of a "support edge" for that class. The support edge of an edge equivalence class is the edge E representing the strongest separation constraint, that is, the edge E having the largest separation value between the ports P it connects. The spacing between the pairs of ports P for all edges E in an equivalence class must satisfy the spacing requirements of the support edge. This is because after hierarchical compaction, the final spacings between the source and sink ports for all edges E in a given equivalence class must be the same. Thus the value of all edges E in an equivalence class can be increased to the value of the support edge without changing the results of the final compaction. Updating 307 results in one equation corresponding to the support edge representing all of the edges E in its edge equivalence class in the final constraint system to be solved by linear programming, thus minimizing the number of equations that need to be solved overall.

Figure 2C:
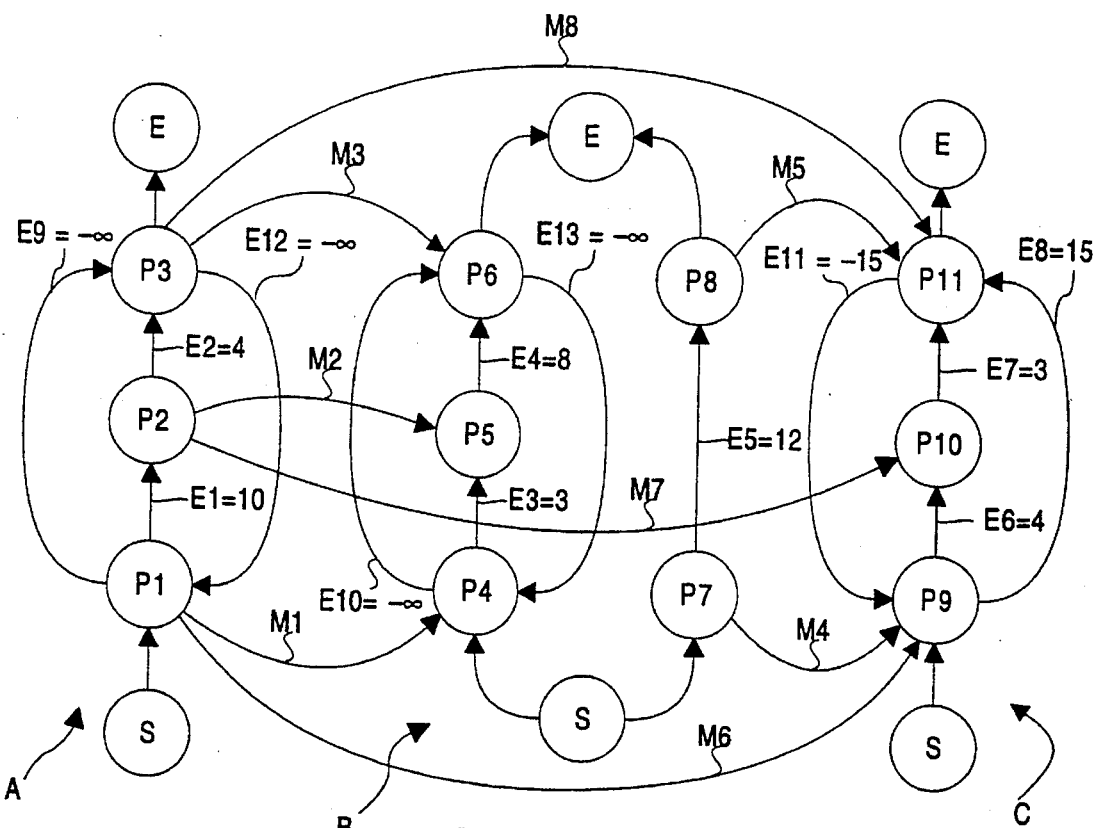
FIG. 2C is a pictorial illustration of three port abstraction graphs following the creation of edge equivalence classes.
Figure 2D:
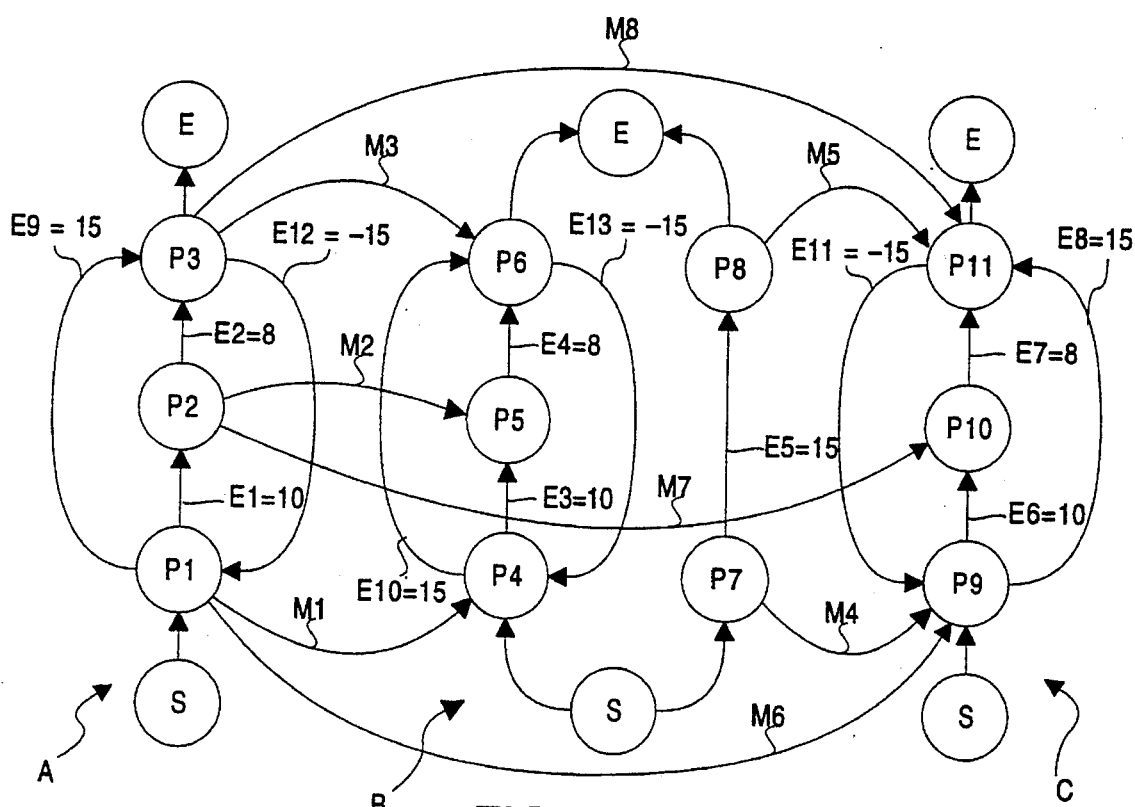
FIG. 2D is a pictorial illustration of three updated port abstraction graphs.

An example of updating 307 of the values of edges E is shown in FIG. 2D. Beginning with the values of the edges shown in FIG. 2C, which are determined as described above using transitive closure, the edge equivalence classes contain {E1, E3, E6}, {E2, E4, E7}, {E5, E8, E9, E10}, and {E11, E12, E13 }. The support edges of these edge equivalence classes are edge E1, E4, E8 and E11, respectively, and these edges are stored in support edge register 29. Update 307 changes the values of the other edges in each of edge equivalence classes to the value of the support edge of the class. Thus, the values of edges E3 and E6 are set to (10), the values of edges E2 and E7 are set to (8), the values of edges E5, E9, and E10 are set to (15), and edges E12 and E13 are set to (–5).

Once the edge equivalence classes are updated 307, the values of some edges E increase to the value of the support edge of the class. This may result in an increase in the total separation value along some interfaces in the port abstraction graphs. For some port abstraction graphs the value of the longest path from a source port to a sink port might have increased enough so that it is now greater than (or equal to) the value of edge between those ports. For example in FIG. 2D, the value of edge E8 (15) is less the value of the path including edges E7 and E6 (8+10=18). Such edges are redundant because they do not capture separation constraints that are not already present along other edges, and are called transitive closure redundant edges.

Figure 2E:
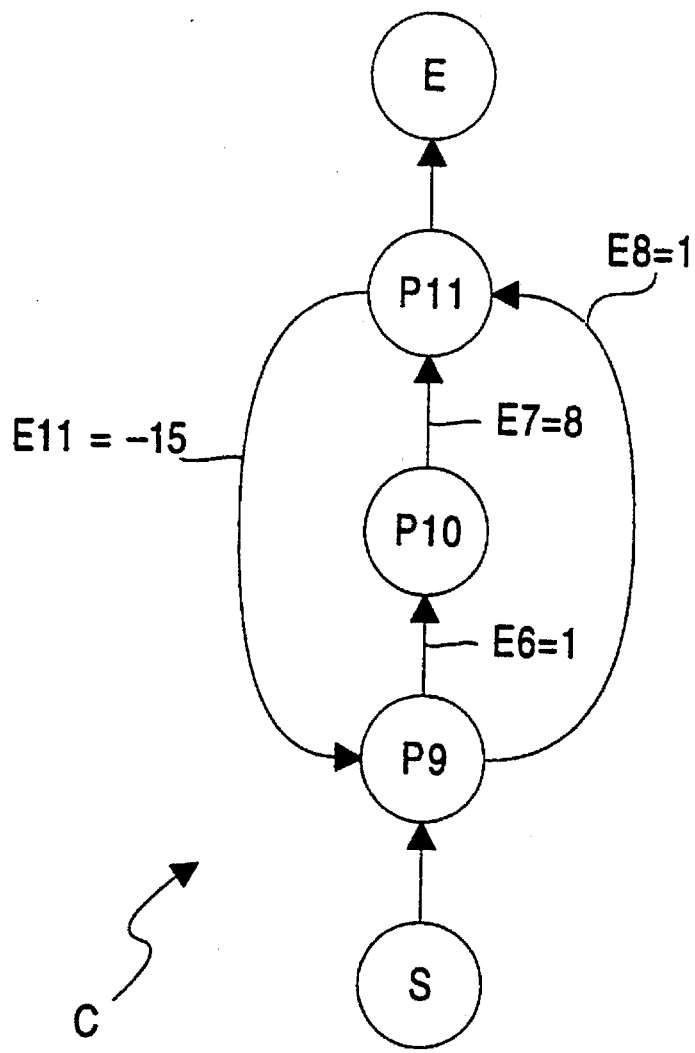
FIG. 2E is a pictorial illustration of a port abstraction graph showing a positive cycle.

To determine which edges have become transitive closure redundant the port abstraction graphs are repropagated 309. This process is achieved by running an all pair shortest path algorithm on all the port abstraction graphs; the preferred embodiment uses a modified Bellman Ford algorithm. The values of the transitive closure redundant edges are changed to the value of the longest path between their source and sink ports. Continuing with the above example, FIG. 2E shows the port abstraction graph of cell C, with the value of E8 set to (18). Transitive closure redundant edges are indicated in layout database 33.

After this repropagation 309, some of the edge equivalence classes might again need to be updated 307 because the values of the transitive closure redundant edges contained in a class will have increased. This in turn causes the values of all edges in the class to increase during the next update 307 of the edge equivalence class. Following the next update 307, another repropagation 309 of the port abstraction graphs occurs, wherein still more edges might become transitive closure redundant.

This sequence of alternating between updating 307 the edge equivalent classes and repropagation 309 of the port abstraction graphs terminates when updating the edge equivalence classes does not increase the value of any edges in that class, or a positive cycle is detected 311 following repropagation 309 of a port abstraction graph.

Positive cycles can result from increases in the values of edges E when the edge equivalence classes are updated 307.

Positive cycles may also result from existing design rules within a cell. Positive cycles are indicative of overconstraints. Accordingly, after repropagation 309, test 311 determines if any positive cycles were formed during the update process. FIG. 2E of cell C following repropagation 309 shows a positive cycle of value (3) along edges E8 (18) and E11 (−15) between ports P9 and P11. In other words, edge E8 requires that port P11 be at least 18 units from port P9 while edge E11 requires that P9 be no more than 15 units from P11. These two separation constraints cannot both be satisfied simultaneously, and thus cell C is overconstrained.

When an overconstraint is detected, layout database 33 is annotated 313 with enough information to completely explain the cause of the overconstraint. The designer can browse 315 through a displayed view of the annotated database and discover the cause of the overconstraint.

In order to provide the designer information with which to correct the cause of overconstraints, it is useful to determine whether the edges involved in the overconstraint came to have their values during the updating 307 of the edge equivalence classes or whether the edge was made transitive closure redundant during graph repropagation 309. This information is created during annotation 313 as follows.

The constraint value on an edge E of a port abstraction graph can be derived from one of the three following categories:

1. The value of an edge E is derived from that of the support edge in its equivalence class. With each such edge E layout database 33 is annotated 313 to identify the support edge of its class.

2. Edge E is a transitive closure redundant edge whose value is derived from the longest path between its source and sink ports P. With each such edge E, layout database 33 is annotated 313 to identify the list of edges on the longest path between the edge's source and sink port in the port abstraction graph.

3. The value of edge E is derived from the longest path between its source and sink port, in the complete constraint graph of that cell. Edges whose values are derived from the complete constraint graph can be without reference to other edges in the port abstraction graph, but merely by reference to the underlying edges in the complete constraint graph. Accordingly, with each such edge, layout database 33 is annotated 313 to identify the list of edges on the longest path between its source and sink in the complete constraint graph.

Figure 5:
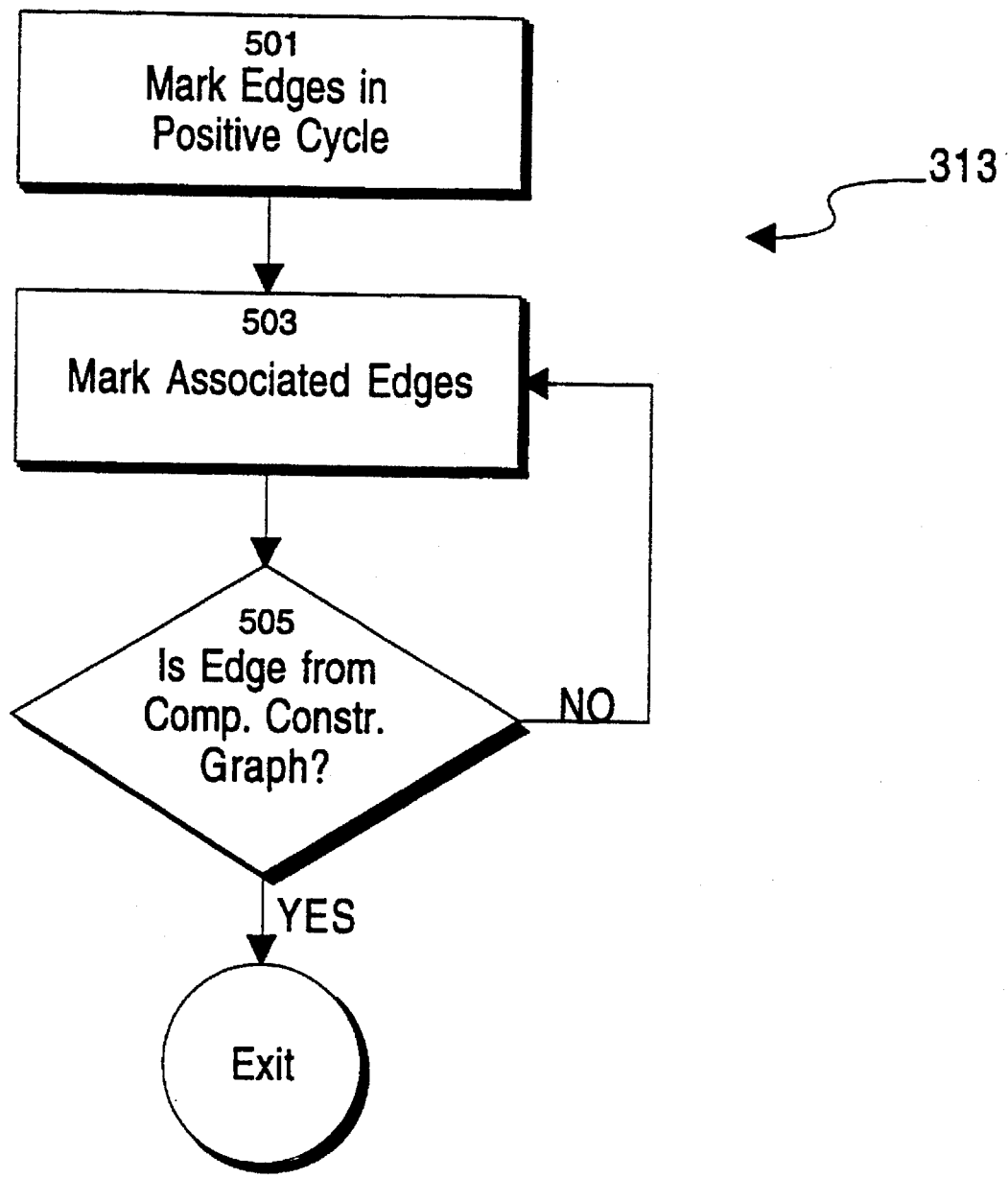
FIG. 5 is a flow chart of the process of annotating a layout database.

FIG. 5 shows a flow chart of annotation process 313. Annotation 313 begins by marking 501 in layout database 33 all the edges E involved in the positive value cycle. Continuing the example of FIG. 2E, edges E8 and E11 are marked in layout database 33 to indicate that they create an overconstraint. After an edge is marked 501 in layout database 33, all associated edges are also marked 503 and the association relations between them indicated. This means that the edges that provided the values to edges in the overconstraint are also marked, and the type of relationship between the edges, from those listed above, is indicated. Thus if an edge becomes part of an overconstraint because it was updated 307 to the value of the support edge of its edge equivalence class, then the support edge is marked 503 in layout database 33, and this relationship is indicated. Continuing the example of FIG. 2E, edge E8 became transitive closure redundant during repropagation 309 because its value was less than the total separation value of the path along edges E7 and E6 from port P9 to port P11. Accordingly, edges E7 and E6 are marked 503 in layout database 33 and the transitive closure redundant relationship is indicated.

Block 503 causes associated edges and the associated relations to be added to the annotated layout database 33. The values on these newly added associated edges are also explained. The value of each such edge can in turn be explained by its own set of associated edges. This recursion terminates when an edge in the complete constraint graph of the cell is encountered because the value of this type of edge is derived from design rule considerations and is not derived from other associated edges. Hence in test 505, when a non "complete constraint graph" edge is encountered block 503 is performed recursively for each of the associated edges.

Returning to the example of FIGS. 2D and 2E, edges E7 and E6 were updated 307 to their values from the values of the support edges E4 and E1 in their respective edge equivalence classes. Thus edges E4 and E1 would be marked 503, and the support edge relationship indicated in layout database 33. The values of E1 and E4 can be derived from edges the complete constraint graph of cell B. These edges in the complete constraint graph do not depend on other edges in the constraint graph. Rather these edges are separation constraints derived directly from design rules, and are the origin of the overconstraints. The designer can change the design rules producing these separation constraints to remove the overconstraint.

Figure 6A:
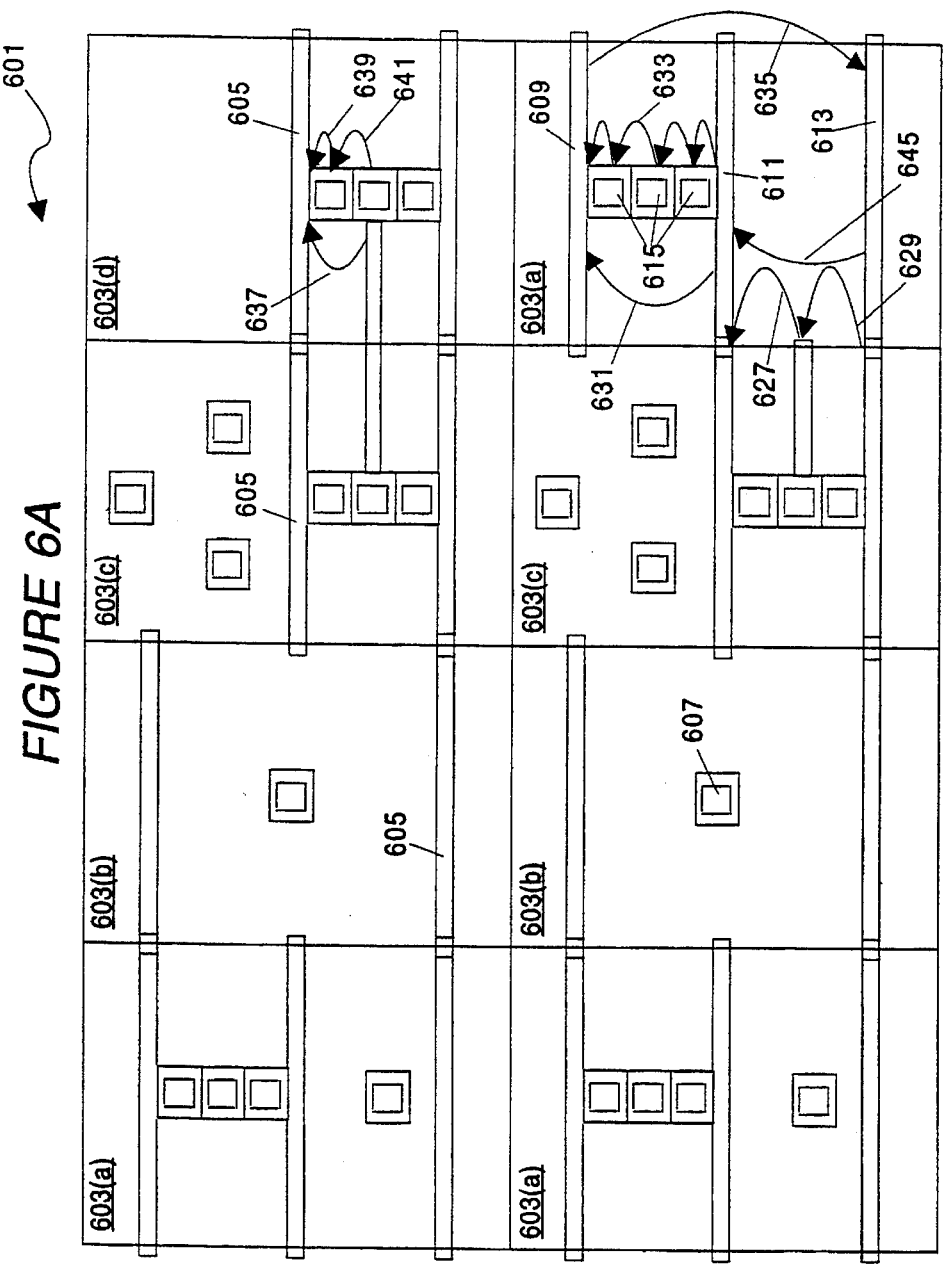
FIG. 6A is a pictorial illustration of a computer display screen showing a window for displaying the annotated layout database.
Figure 6B:
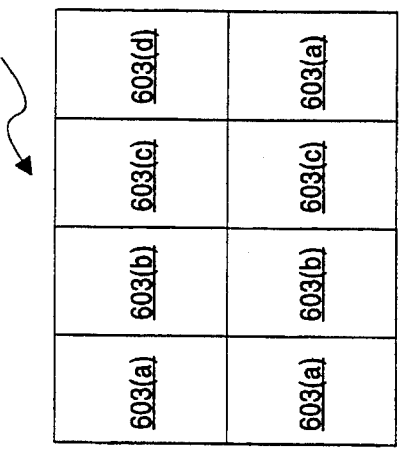
FIG. 6B is a schematic illustration of the window of FIG. 6A.

Once layout database 33 is completely annotated 313, it remains to provide the information about the overconstraints to the designer in a useful manner. An embodiment of the present invention provides a method for displaying the annotated layout database 33. FIG. 6A shows a pictorial illustration of a layout window 601 on computer display 13, and FIG. 6B shows which of the cells of FIG. 6A are the same in the window 601. Window 601 is a mode for translating the information of the port abstraction graphs as annotated 313 in layout database 33 into a visual representation.

Window 601 displays a set of cells 603 forming a portion of a circuit layout. Cells 603(a) are all identical, as are cells 603(b), and 603(c) respectively. Each cell 603 is comprised of ports 605 and contacts 607. These elements are constrained by separation constraints 615–645, which are represented by edges E in the port abstraction graphs of a layout. Thus in cell 603(a) in the lower right corner of FIG. 6, port 609 is related to port 611 by separation constraint 631; port 611 is related to port 613 by separation constraints 627, 629, and 645, and port 609 is related to port 613 by separation constraint 635. The display of window 601 is controlled by control window 701 of FIG. 7.

Figure 7:
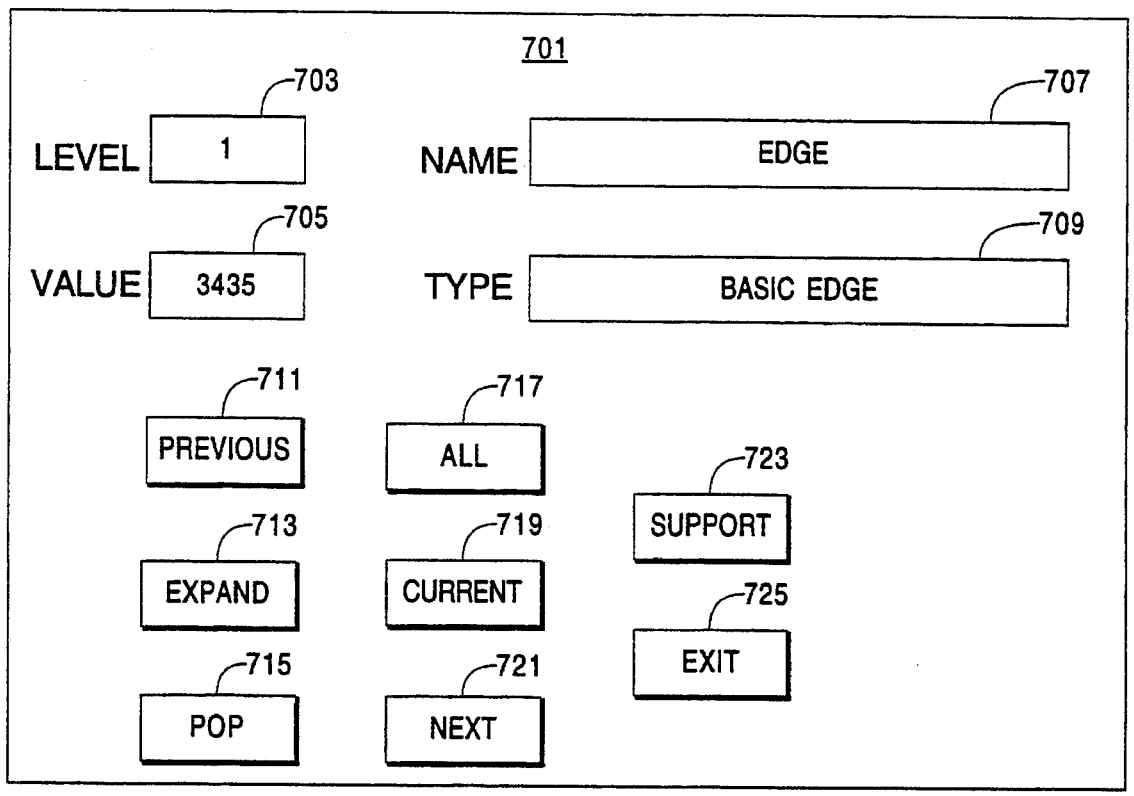
FIG. 7 is a pictorial illustration of a computer display screen showing a control window for controlling the display of the annotated layout database.

In FIG. 7, control window 701 provides information about separation constraints, extracting information from annotated layout database 33. Control window 701 further affords a means for manipulating the display of cells 603 in window 601. Control window 701 displays information about an given separation constraint (edge) selected by the designer using controls 711–725. Controls 711–725 are invoked using conventional inputs devices such as a mouse or a trackball, touch screen, or the like. Once a separation constraint is selected, level field 703 is updated to indicate the level of the selected constraint. The edges involved in the overconstraint cycle are deemed level 1 in level field 703; the edges from which their values were derived are level 2, and so on, according to the level of recursion reached during annotation 501 of layout database 33. Edge value field 705 shows the actual value of the separation constraint. Edge name field 707 shows the name of the selected edge. Edge type field 709 indicates the type of edge selected, according to the three categories set forth above with respect to FIG. 5. The display and function of controls 711–725 is dependent on the current level and element displayed, with only the controls that are applicable at any given time being displayed in control window 701. An example of the use of control window 701 with respect to layout window 601 can now be described.

Upon initially invoking layout window 601 for browsing 315 through layout database 33, the overconstrained ports containing a positive cycle in a port abstraction graph are highlighted, and the fields of control window 701 are updated to display the information for one of the separation constraints in the positive cycle from layout database 33. In the example of FIG. 6, the overconstraint arises between ports 609 and 613 along separation constraints 631, 635, and 645. Simply put, separation constraints 631 and 645 together require a minimum distance between ports 609 and 613 that is greater than the maximum distance specified by separation constraint 635. Initially, ports 609 and 611 are highlighted. The designer can then determine which separation constraints caused the positive cycle by invoking the expand edge control 713 on separation constraint 631. Layout window 601 is then updated to show that the value of separation constraint 631 was induced by separation constraints 633 between contacts 615. One of these separation constraints 633 then becomes the selected edge in control window 701, and the fields are updated with information about the value, name, level, and type of that separation constraint.

For example, if the top most separation constraint 633 was selected, then level field 703 would be updated to "2" since this is the second level from the positive cycle. Invoking next control 721 then selects another separation constraint from this group and display its associated information. Invoking pop control 715 returns to displaying the information for separation constraint 631, and highlighting ports 609 and 611. The designer can then examine separation constraints 645 and 635 in turn. Invoking next control 721 highlights separation constraint 645. Type field 709 indicates that this edge is transitive closure redundant. To learn which constraints made separation constraint 645 transitive closure redundant the designer invokes expand control 713 to expand that edge, thereby highlighting separation constraints 627 and 629. Level field 703 now indicates that the level is 2. The display thus indicates to the designer that separation constraint 645 was transitive closure redundant because it was less than or equal to the combined value of separation constraints 627 and 629. Invoking current control 719 selects one of these separation constraints, namely 627. Type field 709 is updated to display "meta edge." The value of this separation constraint is derived from the support of its edge equivalence class. Invoking support control 723 highlights separation constraint 637 in top right cell 603(*d*) which is the support of that the edge equivalence class of separation constraint 627. Level field 703 is updated to display "3", and type field 709 displays "basic edge." Invoking expand control 713 then expands separation constraint 637 into compactor constraint graph edges 639 and 641. Invoking current control 719 then highlights separation constraint 639. Level field 701 is updated to "4" and type field 709 is updated to "compactor edge." This separation constraint cannot be further expanded (the expand button is removed from display 701) because its value is derived directly from design rule considerations. Invoking pop control 715 resumes the display of separation constraint 637. Level field 703 is decremented to "3", and type field 709 returns to "basic edge" The process of selecting and expanding is repeated by the designer until he is satisfied that he understands the source of the overconstraint.

Once the designer has identified the cause or causes of an overconstraint he then accesses layout database 33 to change the separation values between various circuit elements and then generates a new layout. The layout is then processed for compaction using conventional methods, and then before actual computation of the compaction routine, is processed according to method 300 of the present invention to identify overconstraints in the new layout.

If no overconstraints remain in the new layout, then for each edge equivalence class, it now suffices to create only one separation constraint, the constraint for the support edge of the class. However, the support edge of an edge equivalence class might itself be a transitive closure redundant edge. This is because when the edges belonging to the port abstraction graph are updated their combined values exceeds the value of the support. The support edge of the equivalence class is thus subsumed by the constraints imposed by the edges of the port abstraction graph. In this case the constraint carried by the support edge is already captured by other edges in its port abstraction graph and therefore no constraint is generated. This significantly reduces the number of equations for intracell constraints that need to be solved by linear programming.

Following the removal of all overconstraints, there is a minimal set of equations that define the minimal set of separation constraints for minimizing the layout. These equations are sent 317 to a linear programming process for determination of final compacted layout design.

Referring now to FIG. 4, there is shown a flow chart of the process 305 for creating edge equivalence classes. First, an edge equivalence class is created 401 for each edge in each port abstraction graph, and stored in edge equivalence class register 25. Next, an iterative loop is begun by selecting 403 a first unique leaf cell in the layout from layout database 33. As stated above, layouts generally comprise repeated applications of a small set of cells. Thus, identifying the overconstraints in each unique leaf cell is sufficient to analyze the entire layout.

A second iterative loop is begun by selecting 405 from the port abstraction graph register 23 a first edge in the port abstraction graph for the leaf cell. Next, for the first edge, a first pair of meta-edges having a same interface is identified 407 in the meta-edge register 27. A pair of meta-edges will conform to the requirements set forth above with respect to meta-edge register 27. Once a pair of meta-edges for the first edge are identified 407, it can then be determined 409 whether there is a corresponding edge in a port abstraction graph that shares the meta-edges at its sink and source ports. If there is such an edge, then the edge equivalence classes of the two edges are merged 411, and the results updated to edge equivalence class register 25. If there is no corresponding edge then the first edge is marked 413 in port abstraction graph register 23 to later create 421 corresponding edges in the port abstraction graphs.

After edge equivalence classes are merged 411 or the first edge marked 413, test 415 determines if there is another pair of meta-edges coupled to the first edge. If there is, process 305 loops back to test 409. If there is no other pairs of meta-edges, then test 417 determines whether there is another edge in the port abstraction graph of the first cell. If so, then process 305 loops back to select 405 another edge. If not, then test 419 determines whether there remain any unique cells for analyzing remaining edges. If so, process 305 loops back and selects 403 a next unique leaf cell from layout database 33.

If all unique leaf cells have been examined, then for each marked edge in port abstraction graph register 23 a corresponding edge is created 421 between source and sink vertices that share the meta-edges of the marked edge. The value of each new edge is set to negative infinity. Once the new edges are created, process 305 terminates and control is returned to the main process 300.

Referring to FIG. 2B, an example of process 305 can be described as follows. First, an edge equivalence class is created 401 for each edge in cells A, B, and C. Thus there are initially edge equivalence classes {E1}, {E2}, {E3}, {E4}, {E5}, {E6}, {E7}, {E8} and {E11}.

Next, cell A is selected 403, and a first edge E1 is selected 405. A pair of meta-edges (M1, M2) is identified 407 for edge E1, since these meta-edges run from the source and sink ports of edge E1. A corresponding edge having source and sink ports attached to meta-edges M1 and M2 is located 409 in the port abstraction graph of cell B at edge E3. Thus the equivalence classes {E1} and {E3} are merged 411 into {E1, E3}, and edge equivalence register 25 is updated. At test 415 there is another pair of meta-edges for edge E1, (M6, M7), running between cell A and cell C. A corresponding edge E6 is located 409 and the edge equivalence classes {E1, E3} and {E6} are merged 411 into {E1, E3, E6}.

As there is no other pairs of meta-edges for edge E1 at test 415, another edge, edge E2, is selected 405. A pair of meta-edges (M2, M3) is identified 407 for edge E2, and a corresponding edge E4 is located 409 in the port abstraction graph for cell B at edge E4. The equivalence classes {E2} and {E4} are merged 411 into {E2, E4}. At test 415 there is another pair of meta-edges for edge E2, (M7, M8), running between cell A and cell V. A corresponding edge E7 is located 409 and the edge equivalence classes {E2, E4} and {E7} are merged 411 into {E2, E4, E7}. Since there are no more meta-edges for edge E2 at test 415, and there are no more edges in cell A at test 417, the next cell B is selected 403.

In cell B, a first edge E3 is selected 405. However, there are no pairs of meta-edges that have not been analyzed for the interface for edge E3. Similarly for edge E4. Edge E5 is then selected 405 and a pair of meta-edges (M4, M5) is identified 407. A corresponding edge E8 is located 409 and the equivalence classes {E5} and {E8} are merged 411 into {E5, E8}. These changes are updated to edge equivalence class register 25. There are no remaining edges in cell B at this point.

Finally, cell C is selected 403, and a first edge E6 is selected 405. This edge has no meta-edges that have not been examined. Similarly with edge E7. When edge E8 is selected 405, meta-edge pair (M8, M6) is identified 407. As there is no corresponding edge in cell A at test 409, edge E8 is marked 413 to create an edge in cell A. The next edge E11 is selected 405, and meta-edge pair (M8, M6) identified 407. Since there is no corresponding edge cell A, edge E11 is marked 413 for later creation of an edge.

Now all cells have been tested 419, and the marked edges E8 and E11 are examined 421. For edge E8, edge E9 is created in the port abstraction graph of cell A between ports P1 and P3 and set to negative infinity; the port abstraction graph of cell A is updated in port abstraction graph register 23. For edge E11, edge E12 is created in the port abstraction graph of cell A, similarly to edge E9.

Then the port abstraction graph of cell A is reexamined for edge E9, and since there is meta-edge pair (M1, M3) running to the port abstraction graph of cell B for ports P4 and P6, an edge E10 is created therebetween and set to negative infinity. Edge equivalence classes {E5, E8}, {E9} and {E10} are merged.

The port abstraction graph of cell A is reexamined for edge E12, and the due to meta-edge pair (M1, M3) running to ports P4 and P6, an edge E13 is created therebetween and its separation value is set to negative infinity. The edge equivalence classes {E11}, {E12} and {E13} are merged into {E11, E12, E13}.

At the end of process 305 then, there are edge equivalence classes {E2, E4, E7}, {E1, E3, E6}, {E5, E8, E9, E10} and {E11, E12, E13}. FIG. 2C shows the results of process 305. Control is then returned to process 300.

As describe above, process 300 reduces the number of equations representing separation constraints that must be solved by linear programming during compaction. This allows the creation and compaction of effectively larger layouts. Table 1 shows two examples of the reduction in the number of constraint equations resulting from the use of process 300.

TABLE 1

| Layout No. | Number of LP Equations | |
|---|---|---|
| | With Process 300 | Without Process 300 |
| Example 1 | 350 | 808 |
| Example 2 | 711 | 1908 |

Accordingly, the method and apparatus of the present invention provide a means of identifying overconstraints in the layout of an electrical circuit, and displaying those overconstraints to a circuit designer. The present invention further minimizes the number of equations necessary to compact a layout, thereby effectively increasing the size of layouts that can be compacted.

While the present invention been described in considerable detail in the preferred embodiment for identifying overconstraints in circuit layouts, other embodiments of the invention in other uses or environments are possible. In alternate embodiments, the present invention can be used to identify overconstraints in many diverse structures or systems that requires elements of the structure or system to satisfy rules regarding the interrelation or position of the elements.

For example, in architectural design, the elements that define the structure of a building are subject to various design rules that dictate their relations with one another, such as rules establishing how closely one structural element can be placed to another. Thus, an embodiment of the present invention could be employed to identify overconstraints in the structural design, where the design rule overconstrain the place of various architectural elements. Further, an embodiment of the present invention could be used to identify overconstraints in the allocation of time for the performance of a series of tasks, where certain tasks must be completed within specific time periods with respect to other tasks. In such a context overconstraints represent a set of timing requirements that cannot be satisfied. Thus, in litigation case management where various court rules define the timing of briefs, motions, discovery requests, court appearances, the present invention could identify overconstraints in an attorney's docket for a case or a set of cases.

Further, the present invention can also be applied in other embodiments for reducing the number of equations which define a series of variables representative of a physical system or structure.

The spirit and scope of the invention is not intended to be limited to the description of the preferred embodiment herein, but can be implemented in other environments or combinations, and is capable of modification or changes within the details of the inventive concept described above.

We claim:

1. In a computer automated design system for designing structures having design constraints defined by equations and comprising a memory for storing a plurality of design constraints represented by a set of equations S including a first set of equations having the form (X–Y>=A) and a second set of equations having the form (X–Y=Z–W) where A is any constant and X, Y, W and Z are real variables, a graph based method for removing redundant equations of the first set of S, thereby reducing the total number of equations in S, the method comprising the steps of:

a) generating and storing in the memory a graph of the first and second set of equations, such that each real variable is represented by a vertex and for each equation of the form (X–Y>=A) creating in the graph an edge E(X,Y) having a value equal to A and coupling a vertex representing X to a vertex representing Y, and for each equation of the form (X–Y=Z–W), if an edge E(Z,W) does not already exist in the graph, creating the edge E(Z,W) having a value equal to negative infinity coupling a vertex representing Z to a vertex representing W;

b) generating and storing in the memory edge equivalence classes for the edges in the graph such that for an edge E(X,Y) and an edge E(Z,W), E(X,Y) and E(Z,W) are in the same equivalence class if there is an equation in S of the form (X–Y=Z–W), and where if E(X,Y) and E(Z,W) are in the same equivalence class, then an edge E(Q,R) coupling a vertex representing a real variable Q to a vertex representing a real variable R is in the same edge equivalence class as E(X,Y) if E(Q,R) and E(Z,W) are in the same edge equivalence class;

c) updating the edges in the edge equivalence classes stored in the memory by setting the value of each edge in an equivalence class to the value of an edge in the edge equivalence class having the greatest value A, the edge having the greatest value A being a support edge of the edge equivalence class;

d) repropagating the graph in the memory to identify transitive closure redundant edges;

e) repeating steps c) and d) if the value of any edge changed in step d) or c)

f) replacing all the equations in the first set by equations of the form (X–Y>=A) where edge E(X,Y) having value A is the support edge for its edge equivalence class and is not transitive closure redundant; and g) storing the replaced equations in the memory with the second set of equations in S.

2. The method of claim 1, after step d) further comprising the steps of:

detecting positive cycles within the graph, a positive cycle being indicative of an overconstraint in the system of equations; and if a positive cycle is detected, annotating the equations in memory to indicate the overconstraint.

3. In a computer aided design system for designing electical circuits, and comprising a memory for storing a plurality of constraint equations S describing constraints between electrical elements in an electrical system, where S includes a first set of constraint equations having the form (X–Y>=A) and a second set of constraint equations having the form (X–Y=Z–W) where A is any constant and X, Y, W and Z are real variables, the system further comprising a processor for computing a value for each constraint equation in S, a graph based, computer implemented method for removing redundant constraint constraints of the first set of S from the memory, thereby reducing the total number of constraint equations in S to be computed by the processor, the method comprising the steps of:

a) generating and storing in the memory a graph of the first and second set of constraint equations, where each real variable, X, Y, W, or Z, in each constraint equation is represented by a vertex in the graph;

b) for each constraint equation of the form (X–Y>=A), creating in the graph an edge E(X,Y) having a value equal to A and coupling a vertex representing X to a vertex representing Y;

c) for each constraint equation of the form (X–Y=Z–W), determining if there is an edge E(Z,W) in the graph, and responsive to there being no edge E(Z,W) in the graph creating the edge E(Z,W) having a value equal to negative infinity coupling a vertex representing Z to a vertex representing W;

d) generating and storing in the memory edge equivalence classes for the edges in the graph such that for an edge E(X,Y) and an edge E(Z,W), E(X,Y) and E(Z,W) are in a same equivalence class if there is an equation in S of the form (X–Y=Z–W) and where if E(X,Y) and E(Z,W) are in the same equivalence class, then an edge E(Q,R) coupling a vertex representing a real variable Q to a vertex representing a real variable R is in the same edge equivalence class as E(X,Y) if E(Q,R) and E(Z,W) are in the same edge equivalence class;

e) updating the edges in the edge equivalence classes stored in the memory by setting the value of each edge in an equivalence class to the value of an edge in the edge equivalence class having the greatest value A, the edge having the greatest value A being a support edge of the edge equivalence class;

f) repropagating the graph in the memory to identify transitive closure redundant edges;

g) repeating steps e) and f) if the value of any edge changed in step e) or f)

h) replacing all the constraint equations in the first set by constraint equations of the form (X–Y>=A) where edge F,(X,Y) having value A is the support edge for its edge equivalence class and is not transitive closure redundant;

i) storing the replaced constraint equations in the memory with he second set of constraint equations in S; and j) solving the constraint equations in S to determine the constraints between the electrical elements in the electrical system.

* * * * *